United States Patent [19]
Guccione

[11] Patent Number: 5,995,744
[45] Date of Patent: Nov. 30, 1999

[54] NETWORK CONFIGURATION OF PROGRAMMABLE CIRCUITS

[75] Inventor: Steven A. Guccione, San Jose, Calif.

[73] Assignee: Xilinx, Inc., San Jose, Calif.

[21] Appl. No.: 09/023,334

[22] Filed: Feb. 13, 1998

Related U.S. Application Data

[62] Division of application No. 08/976,750, Nov. 24, 1997.

[51] Int. Cl.$^6$ ........................... G06F 15/177; G06F 19/00
[52] U.S. Cl. ...................... 395/500.44; 395/653; 395/712
[58] Field of Search .................................. 364/489, 488, 364/578; 395/712, 653, 651, 700, 829, 500

[56] References Cited

U.S. PATENT DOCUMENTS

| | | | |
|---|---|---|---|
| 5,109,353 | 4/1992 | Sample et al. | 364/578 |
| 5,321,840 | 6/1994 | Ahlin et al. | 395/700 |
| 5,361,373 | 11/1994 | Gilson | 395/800 |
| 5,469,003 | 11/1995 | Kean | 326/39 |
| 5,684,980 | 11/1997 | Casselman | 395/500 |
| 5,794,033 | 8/1998 | Aldebert et al. | 395/653 |
| 5,802,290 | 9/1998 | Casselman | 395/200 |
| 5,870,610 | 2/1999 | Beyda | 395/712 |

FOREIGN PATENT DOCUMENTS

| | | | |
|---|---|---|---|
| 0806737A2 | 11/1997 | European Pat. Off. | G06F 17/50 |

OTHER PUBLICATIONS

Eric Lechner and Steven A. Guccione, "The Java Environment for Reconfigurable Computing" International Workshop on Field Programmable Logic and Applications, FPGAS, Sep. 1, 1997, pp. 284–293.

Patrice Bertin and Herve Touati, "PAM Programming Environments: Practice and Experience", Digital Equipment Corporation, Paris Research Laboratory, 85, avenue Victor Hugo, 92500 Rueil–Malmaison, France, IEEE Workshop on FPGAs for Custom Computing Machines, Apr. 10–13, 1994, Napa Valley, CA, pp. 133–138.

Alan Wenban and Geoffrey Brown, "A Software Development System for FPGA–Based Data Acquistion Systems", School of Electrical Engineering Cornell University, Ithaca, N.Y. 14853, IEEE Symposium on FPGAs for Custom Computing Machines, Apr. 17–19, 1996, Napa Valley, CA, pp. 28–37.

David A. Clark and Brad L. Hutchings, "Supporting FPGA Microprocessors through Retargetable Software Tools", Dept.of Electrical and Computer Engineering, Brigham Young, Univ., Provo, UT 84602, IEEE Symposium on FPGAs for Custom Computing Machines, Apr. 17–19, 1996, Napa Valley, CA, pp. 195–203.

(List continued on next page.)

*Primary Examiner*—Kevin J. Teska
*Assistant Examiner*—Lonnie A. Knox
*Attorney, Agent, or Firm*—Lois D. Cartier

[57] ABSTRACT

An interactive graphical software tool is provided that can be used to report the configuration data (i.e., the state of the various configuration bits) in a programmed device as well as to probe and stimulate circuits in the programmed device. A graphical or textual representation of the configuration data can be displayed. When used with a programmable device having addressable flip-flops, such as a member of the Xilinx XC6200 family, one embodiment of the invention can change the state of any addressable flip-flop in the configured device. The graphical tool of the invention is preferably implemented using a high level programming language such as Java and features a graphical point and click user interface, remote access to hardware, and symbolic debug capability. According to another aspect of the invention, data can be written into a programmable device using an interactive software tool and a hardware device designed to interface with the programmable device. The software tool can optionally access the hardware device via a network server, thereby enabling remote configuration of the programmable device.

26 Claims, 4 Drawing Sheets

OTHER PUBLICATIONS

Jeffrey M. Arnold, "The Splash 2 Software Environment", IDA Supercomputing Research Center, 17100 Science Dr., Bowie, MD 20715, IEEE Workshop on FPGAs for Custom Computing Machines, Apr. 5–7, 1993, Napa Valley, CA, pp. 88–93.

H. Hogl, A. Kugel, J. Ludwig, R. Manner, K. Noffz, R. Zoz, "Enable ++: A Second Generation FPGA Processor", Lehrstuhl fur Informatik V, Universitat Mannheim, IEEE Symposium on FPGAs for Custom Computing Machines, Apr. 19–21, 1995, Napa Valley, CA, pp. 45–53.

Beat Heeb, Cuno Pfister, "Chameleon: A Workstation of a Different Colour", Institut fur Computersysteme, ETH Zurich, CH–8092 Zurich, Switzerland, Second International Workshop on Field–Programmable Logic and Applications, Vienna, Austria, Aug./Sep. 1992, pp. 152–161.

"Hardware Debugger Reference/User Guide", published Oct., 1995, available from Xilinx, Inc., 2100 Logic Drive, San Jose, California 95124.

Nisbet and Guccione, "The XC6200DS Development System", Proceedings of the 7th International Workshop, on Field–Programmable Logic and Applications FPL '97, edited by W. Luk, P. Cheung, and M. Glesner, and published by Springer–Verlag, pp. 61–68.

Xilinx 1996 Data Book entitled "The Programmable Logic Data Book", published Sep., 1996, available from Xilinx, Inc., 2100 Logic Drive, San Jose, California 95124, pp. 4–251 through 4–274.

Virtual Computer Corporation Press Release, High Performance Results with New Hardware Software Co–Design System, dated Jan. 21, 1'997 downloaded from Interrnet.

Virtual Computer Corporation Internet item, 'H.O.T. Works—The complete PCI–XC6200 Development System' Jan. 21, 1997.

The University of Birmingham, 'Derik—Introduction' with figure *Virtual Derik*, May 1997.

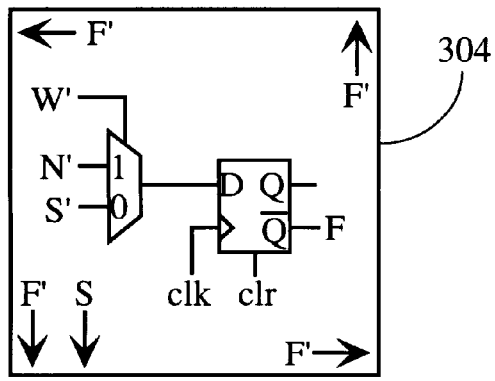
FIG. 4a
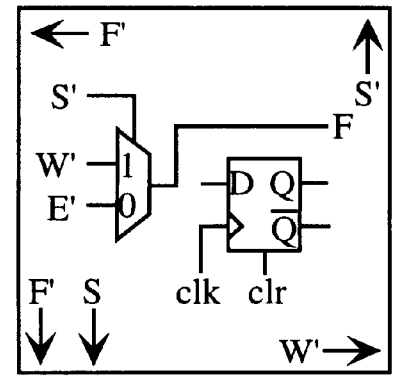
FIG. 4b
N: F'; S: F';
E: F'; W: F';
X1: W'; X2: N';
X3: S';
Y2: X2; Y3: X3;
RP: No protect;
CS: Q'; M: X3'
 (State 0x0)
FIG. 4c

```

#   Symbol file for WebScope

# Name     Col    Map_high        Map_low       R/W    Value
#-----     ---    --------        -------       ---    -----
clock      3      0xffffffff      0xffffff7f    W      0
clock      3      0xffffffff      0xffffff7f    W      1
random     5      0xffffffff      0x000000ff    R
```

| Name | Col | Map (high) | Map (low) | Value |
|------|-----|------------|-----------|-------|
| clock | 3 | 0xffffffff | 0xffffff7f | 0 |
| clock | 3 | 0xffffffff | 0xffffff7f | 1 |
| random | 5 | 0xffffffff | 0x000000ff |  |

NETWORK CONFIGURATION OF PROGRAMMABLE CIRCUITS

CROSS-REFERENCE TO RELATED APPLICATIONS

This application is a divisional application of commonly assigned co-pending U.S. patent application Ser. No. 08/976,750, invented by Steven A. Guccione and filed Nov. 24, 1997, which is incorporated herein by reference.

BACKGROUND OF THE INVENTION

1. Field of the Invention

The invention relates to graphical methods for debugging electronic circuits. More particularly, the invention relates to an interactive graphical software tool for probing and stimulating circuits in programmable logic devices such as field programmable gate arrays (FPGAs).

2. Description of the Background Art

Electronic systems including programmable logic devices have been increasing in popularity and are now common. However, while many hardware platforms have been built, software support for testing and debugging the programmable devices in these systems has lagged. In the area of software support, the emphasis has been on design tools. By contrast, few debug environments for the programmable devices in these logic systems have been developed. While the programmable devices are typically thoroughly tested prior to being included in the systems, it has heretofore been difficult to completely test configured (programmed) devices within the system. The post-programming configuration data must be inferred from the behavior of the programmed device, or from viewing the states of known "probe points" on the device.

Some debug tools for programmable logic systems are known. These tools typically provide one or both of two types of functionality, symbolic debug and state readback display. Symbolic debug provides a table of variable or signal names whose value changes over time. The data may be displayed as a table or as a waveform, similar to a hardware logic analyzer. The variable or signal names correspond to probe points. One such debug tool, the "Xilinx Hardware Debugger", is described in the "Hardware Debugger Reference/User Guide" (hereinafter referred to as the "Xilinx Hardware Debugger Guide"), published October, 1995, available from Xilinx, Inc., 2100 Logic Drive, San Jose, Calif. 95124, which is incorporated herein by reference in its entirety. (Xilinx, Inc., owner of the copyright, has no objection to copying these and other pages referenced herein but otherwise reserves all copyright rights whatsoever.) As shown on page 1–2 of the Xilinx Hardware Debugger Guide, the probe points are limited to Configurable Logic Block (CLB) outputs, I/O Block (IOB) outputs, and RAM/ROM outputs for the Xilinx XC4000 FGPA device. The symbolic debug process is described in Chapter 6 of the Xilinx Hardware Debugger Guide.

State readback display provides the complete state of the supported latched signals of the FPGA device, typically the outputs of each flip-flop or CLB. Patrice Bertin and Hervi Toutai reference a software programming environment called "SHOWRB" that can display the state of each FPGA flip-flop in pages 133–138 of "IEEE Workshop on FPGAs for Custom Computing Machines", edited by Duncan A. Buell and Kenneth L. Pocek, published April, 1994 by the IEEE Computer Society Press, Los Alamitos, Calif., which pages are incorporated herein by reference.

When either symbolic debug or state readback display is used, the functionality of the configured device can be verified by watching the behavior of the displayed probe points in response to inputs applied to device input (or input/output) pads. The Xilinx Hardware Debugger supplies a limited number of input signals to the input/output (I/O) pins of the configured device: clocks, configuration input data (as part of a configuration bitstream), configuration control signals, and a signal that triggers a configuration data readback sequence. (See pages 4–7 and 4–8 of the Xilinx Hardware Debugger Guide.) Other inputs can be externally generated and applied to other I/O pins.

The Xilinx Hardware Debugger also offers a means to verify that the configuration data loaded into the device matches the bitstream used to configure the device. As described on pages 5–5 and 5–6 of the Xilinx Hardware Debugger Guide, when the Verify command is issued, the number of verified bits is reported. The user must then check that the number of verified bits corresponds to the number of downloaded bits. If the numbers correspond, the configuration data matches the bitstream. If not, an error has occurred. The location of the error is not reported. The symbolic debug data, observed data about the behavior of the system, or other data must be used to track down the error. The resulting debug process can be time-consuming and laborious.

It is therefore desirable to have direct access to the configuration data of a configured device in order to more quickly and easily determine the source of an error in a configured device that is part of an electronic system. It is also desirable to simplify the debug process by providing the ability to apply stimulus to probe points distributed throughout the configured device, rather than to a set of I/O pins having limited functionality.

SUMMARY OF THE INVENTION

An interactive graphical software tool and method are provided that can be used to report the configuration data (i.e., the state of the various configuration bits) in a programmed device as well as to probe and stimulate circuits in the programmed device. A graphical or textual representation of the configuration data can be displayed. When used with a programmable device having addressable flip-flops, such as a member of the Xilinx XC6200 family, one embodiment of the invention can change the state of any addressable flip-flop in the configured device. Using this method, a wide variety of stimuli can be applied to any of a large number of points in the configured device, greatly simplifying the debug process.

According to another aspect of the invention, data can be written into a programmable device using an interactive software tool and a hardware device designed to interface with the programmable device. The software tool can optionally access the hardware device via a network server, thereby enabling remote configuration of the programmable device.

The unique ability to display the configuration data read from the device has many applications. For example, this capability can facilitate the hardware testing of an FPGA and the location of errors. Configuration data can be written to the device, then read back from the configured device. The resulting information is not limited to "there is an error somewhere on the device", as in the prior art, but provides means for directly verifying the nature and location of the error.

The ability to display the configuration data can also be used for debugging circuits implemented in the configured device, and therefore for debugging software that creates such circuits. In one embodiment, the information is displayed in a format that actually draws a picture of the logic implemented in a configured logic cell. For example, a logic cell configured as a NAND-gate driving a flip-flop is represented by a picture of a NAND-gate symbol (similar to a schematic symbol) with its output driving the data input of a flip-flop symbol. Circuit errors are easily detected. This aspect of the invention has particular relevance to a growing application of reconfigurable logic, the use of FPGAs as co-processors. In this application, a microprocessor programs all or a portion of an FPGA to perform subroutines. The subroutine is typically changed frequently to meet the requirements of the software program running on the microprocessor; therefore the microprocessor is frequently "designing" new FPGA circuits on the fly. Testing the microprocessor functionality in this area is historically difficult, but the process is greatly simplified by applying the methods of the invention.

The graphical tool of the invention is preferably implemented using a high level programming language such as Java™ and features a graphical point and click user interface, remote access to hardware, and symbolic debug capability. ("Java" is a trademark of Sun Microsystems, Inc.) Therefore, the graphical, interactive software interface of the invention interacts directly with the electronic development system at the hardware level. In this respect the invention more closely resembles In-Circuit Emulators (ICEes) popular in microprocessor development environments than it resembles a software debugging environment. Because it operates primarily at the hardware level, the invention operates independently of other design tools or software packages. This independence enhances the portability of the invention.

BRIEF DESCRIPTION OF THE DRAWINGS

The present invention is illustrated by way of example, and not by way of limitation, in the following figures, in which like reference numerals refer to similar elements.

FIG. 4a shows the status box for one logic block of the circuit of FIG. 3 in graphical mode.

FIG. 4b shows the status box for another logic block in graphical mode.

FIG. 4c shows the status box for the logic block of FIG. 4a in textual mode.

DETAILED DESCRIPTION OF THE DRAWINGS

An interactive graphical tool according to the invention is described. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.
System Architecture of a Preferred Embodiment One embodiment of the invention is a graphical tool called "WebScope". WebScope is implemented in the Java high level programming language. Therefore, WebScope can run on a variety of hosts, from PCs to workstations, using the same small set of files. Additionally, this embodiment may be run either using local hardware, or remotely using hardware on another host. This flexibility is useful in situations where several users wish to share the hardware, or in cases where physical access to the hardware is not possible. To operate WebScope remotely, it is necessary to run a network server. This server negotiates network connections and provides the interface from the network to the physical hardware.

The WebScope embodiment of the invention can be run either as a standalone application using a Java interpreter, or as an applet running from a Web browser such as Netscape® or the Microsoft Internet Explorer. ("Netscape" is a registered trademark of Netscape Communications Corporation.) Such applets are well-known in the software engineering art.

Figure 1:
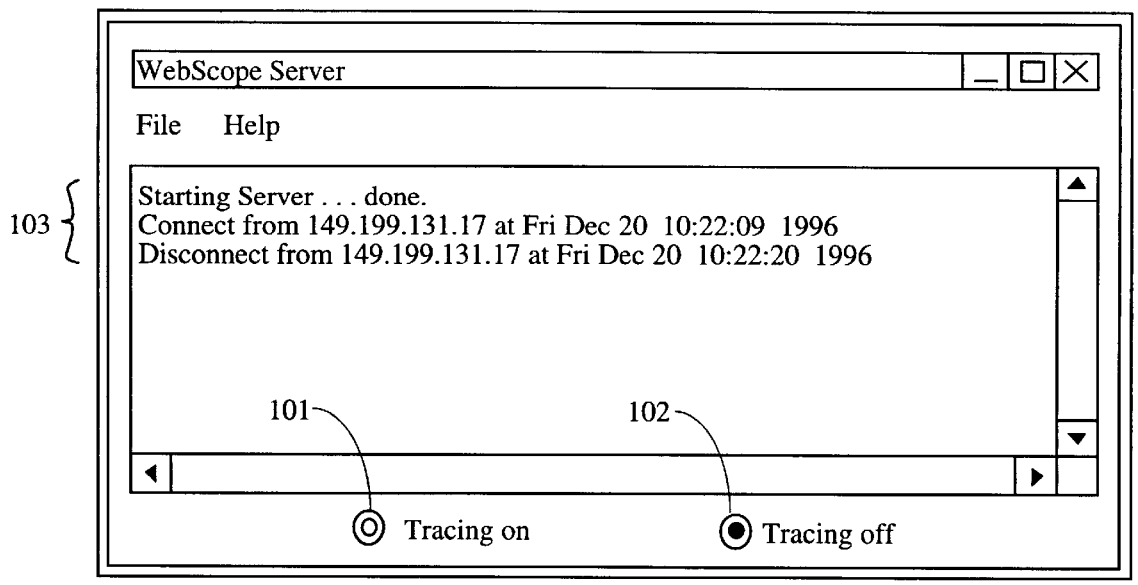
FIG. 1 shows the interface to the WebScope remote server, WebScope being a preferred embodiment of the invention.

The server supplied with WebScope is called "WsServer". (Some embodiments of the invention use other remote servers, while others only operate locally.) Like WebScope itself, WsServer is a Java application. FIG. 1 shows the remote server interface. In this embodiment, all connections and disconnections to the hardware are logged, both to a window on the server (as in lines 103) and to a file. Clicking on "Tracing on" button 101 enables the Tracing option. (The term "clicking on" as used herein means "clicking the mouse button with the cursor positioned on", or otherwise indicating a particular location in a graphical display.) Clicking on "Tracing off" button 102 disables the Tracing option. The Tracing option, when enabled, displays more detailed information about the operations being performed remotely by WebScope.

Figures 2A, 2B:
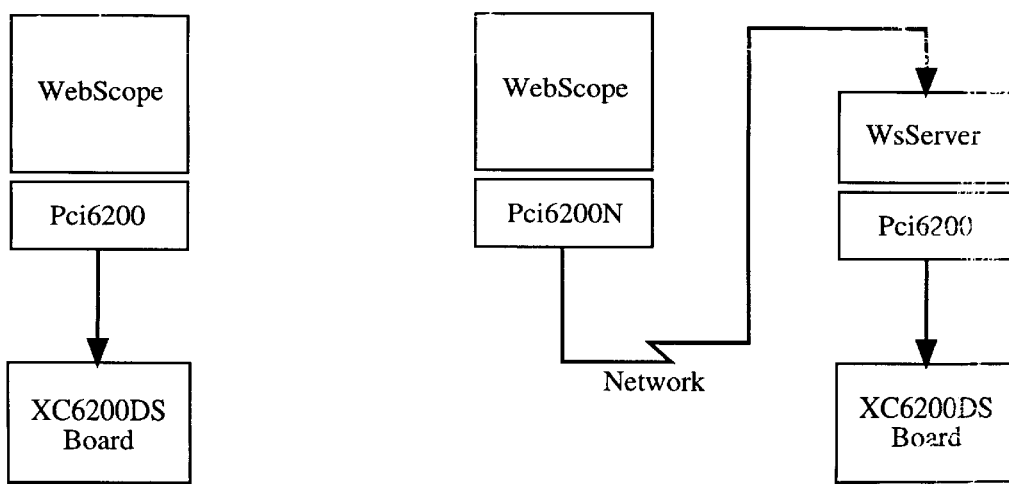
FIG. 2a shows the WebScope system architecture in the local access mode.
FIG. 2b shows the WebScope system architecture in the remote access mode.

FIGS. 2a and 2b show the system architecture of WebScope. In FIG. 2a, the local access mode is illustrated. In FIG. 2b, the remote access mode is illustrated. All communication between WebScope and the target hardware occurs through a well-defined interface, the Pci6200 interface, which is used in both modes. The Pci6200 software interface is included in the commercially available XC6200DS Development System from Xilinx, Inc., the assignee of the present invention. Such software interfaces are well-known in the software engineering art. The XC6200DS Development System also comprises a PCI board containing a Xilinx XC6216 FPGA. (This board is referred to herein as an "XC6200DS board".)

The XC6200DS Development System provides communication between system software (including the software of the present invention) and the XC6216 FPGA. The XC6200DS system enables reading configuration data from a programmed XC6216 device, reading the state of addressable probe points on the device (for this device, the output of each logic cell), and writing to addressable flip-flops. Support for these read and write capabilities is designed into the XC6200 devices. The Xilinx XC6200 FPGA family is described on pages 4–251 through 4–274 of the Xilinx 1996 Data Book entitled "The Programmable Logic Data Book" (hereinafter referred to as "the Xilinx Data Book"), published September, 1996, available from Xilinx, Inc., 2100 Logic Drive, San Jose, Calif. 95124, which are incorporated herein by reference. The XC6200DS Development System is described by Nisbet and Guccione in pages 61–68 of "Field-Programmable Logic and Applications", Proceedings of the 7th International Workshop, FPL '97, edited by W. Luk, P. Cheung, and M. Glesner, and published by Springer-Verlag, which pages are incorporated herein by reference.

The WebScope embodiment of the invention is designed to operate with the XC6200DS Development System. However, WebScope is designed to port easily to systems other than the XC6200DS, provided that the XC6200 programmable device is used in the system. Additionally, other embodiments of the invention operate with other systems using other programmable devices.

In the networked version of this interface, shown in FIG. 2b, the Pci6200N software interface provides the communication between WebScope and WsServer, the remote server. The Pci6200N interface is also included in the commercially available XC6200DS Development System.

Three Display Modes

The WebScope embodiment of the invention has three display modes:

Graphical: Displays logic cell outputs and configuration data for configured logic cells Symbolic: Displays stimulus and permits editing of read/write variable values.

Waveform: Displays waveform traces of variable values.

Figure 3:
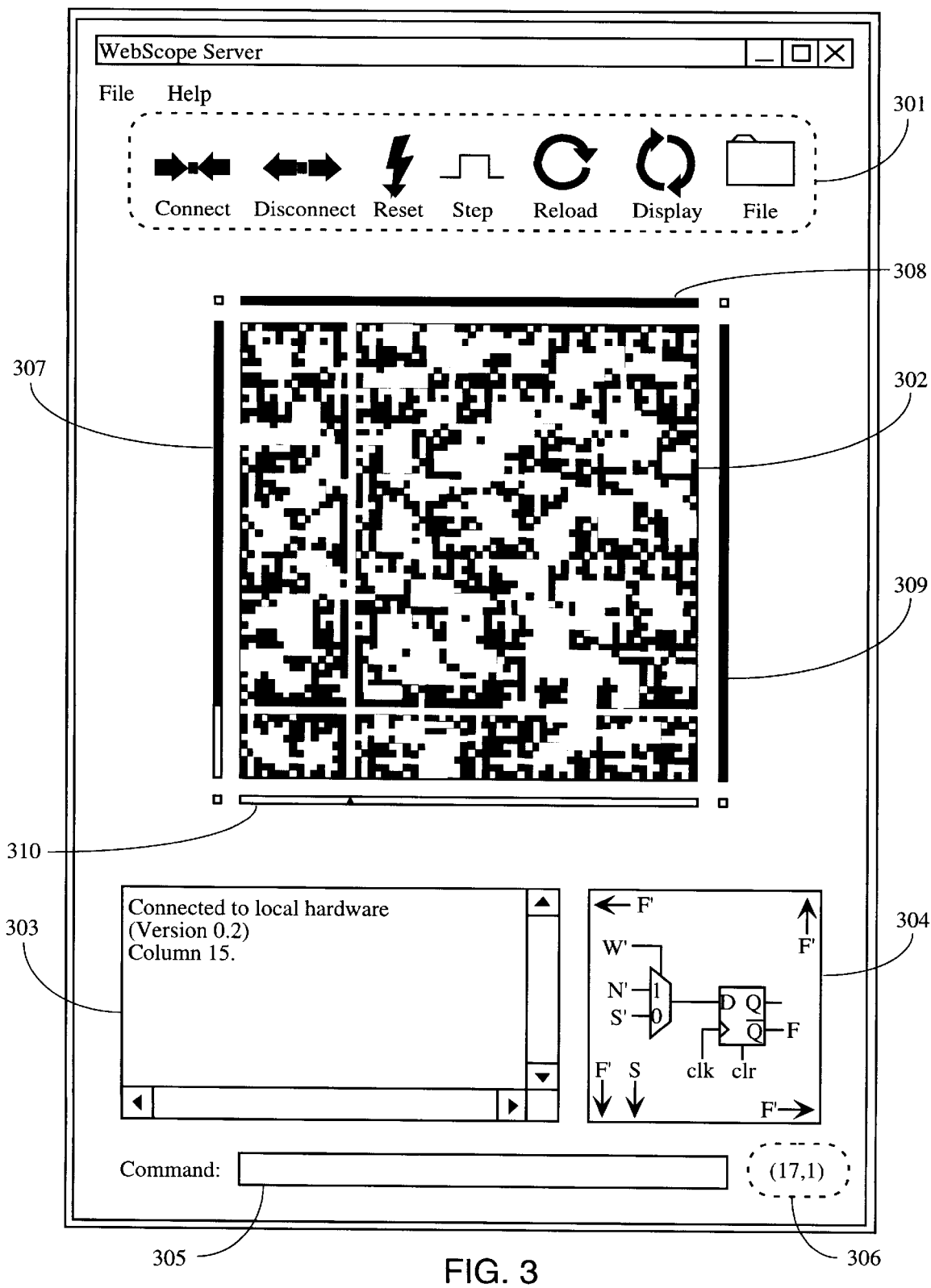
FIG. 3 shows the graphical display of the WebScope tool for an exemplary circuit.
Figures 5, 6, 7:
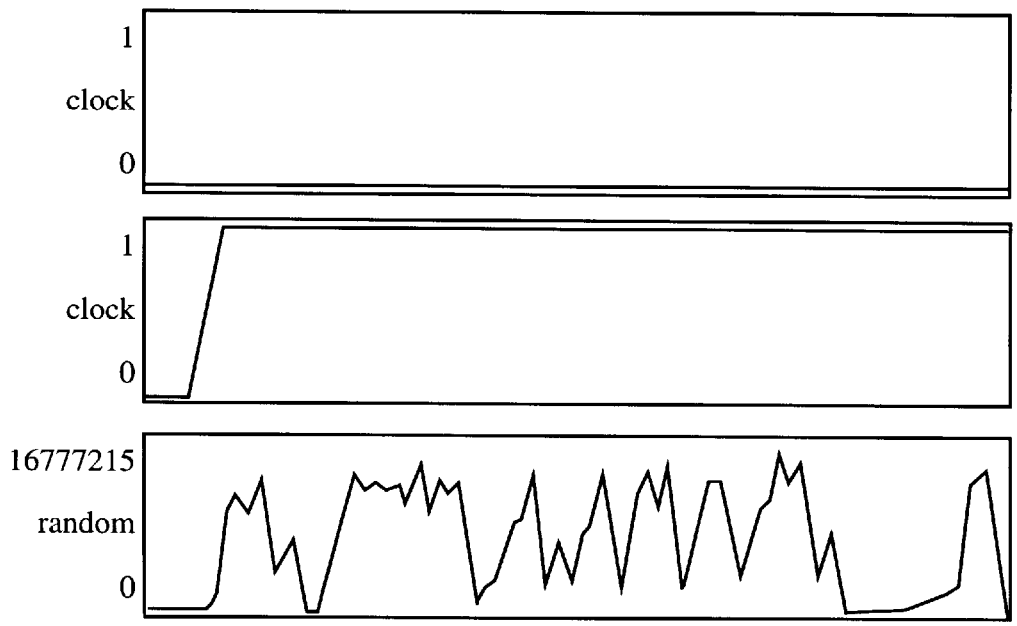
FIG. 5 shows an exemplary symbol file.
FIG. 6 shows a WebScope symbolic display resulting from the symbol file of FIG. 5.
FIG. 7 shows a WebScope waveform display also resulting from the symbol file of FIG. 5.

These modes are shown in FIGS. 3, 5, and 7, respectively, and are discussed with reference to the associated figures. The graphical display is the default display, i.e. the display shown when WebScope is initialized.

FIG. 3 shows the graphical display mode of the WebScope graphical tool for an exemplary circuit. The graphical display comprises several different displays, including command panel 301, cell grid 302, status window 303, status box 304, and command text window 305. The graphical display is used primarily to probe logic cell output states and configuration data from memory cells in a configured target device.

Command Panel

Referring to FIG. 3, the primary control provided by WebScope is via command panel 301, the row of buttons across the top of the display. Command panel 301 is present in all three display modes. In this embodiment, the available commands are Connect, Disconnect, Reset, Step, Reload, Display, and File. When WebScope is initialized, only the Connect button is enabled. In one embodiment, the disabled buttons are "grayed out", i.e., displayed with gray text instead of black. The Connect button connects WebScope to the target XC6200DS board. The other command buttons become active only after successfully connecting to the target hardware. This connection is accomplished by accessing the hardware either directly (preferably via a device driver) or remotely (preferably via a network and the "WsServer" server).

The Disconnect button is used to terminate the connection with the target hardware. Once WebScope is disconnected from the hardware, all command buttons except for the Connect button are disabled. In one embodiment, the state of the XC6200DS board remains unchanged even after disconnecting from the target. Activating the Connect command again resumes the session where it was left off.

The Reset button is used to reset the hardware to its default state by toggling a hardware "reset" line built into the XC6200DS development system.

The Step button is used to advance the state of the system, i.e., it sends a single clock pulse to the hardware. In addition, symbol file information is accessed, as discussed in more detail with reference to FIG. 5, below.

The Reload button is used to re-read all of the data from the target XC6200 device and re-display the result. This command is particularly useful when some external software has modified the state of the hardware.

The Display button is used to toggle WebScope's primary display between the three available display modes.

The File button is used to load files into WebScope. When this button is clicked, a dialog box opens, requesting a file name. The type of file to be loaded is selected by the buttons in the display. In one embodiment, XC6200 CAL configuration data files and SYM symbol files can be loaded. (SYM files are described below with reference to FIG. 5.)

Graphical Display Mode

For the XC6200DS system, the graphical display comprises cell grid 302. Cell grid 302 is a grid of 64×64 squares, representing the state of the logic cells in an XC6216 device. Each XC6200 logic cell has a single output (other than interconnect outputs), which is a probe point in this device. The preferred embodiment uses differently colored squares to convey state information. For example, a green square may represent a cell with a logic '1' output while a red square represents a logic '0'. In FIG. 3, black and white squares represent logic '1's and '0's. (The pattern shown in FIG. 3 is exemplary and does not necessarily represent the actual configuration data in a configured XC6200 device.)

Cell grid 302 is surrounded on its four sides by bars. Bar 307 to the left of cell grid 302 represents the Map register. The XC6200 Map register determines which cells in the device are used during state accesses. Black cells indicate bits masked off by the Map Register, while white cells indicate enabled bits. The number of enabled bits may be less than the current bus width setting of the system (set in the CAL configuration data file or from the command line), in which case the bus includes extra bits that are ignored by the user. However, if the number of enabled bits is larger than the current bus width setting, the user will not be reading the data he or she expects to see. Therefore, a warning for this condition is preferably built into the system. In this embodiment, gray cells (not shown in FIG. 3) in bar 307 indicate bits that are enabled by the Map Register, but do not appear on the external bus, due to the current bus width setting.

Below cell grid 302 is Column Selector bar 310, used to point to a given column in the array. Clicking on bar 310 highlights a column of cells in the array. In FIG. 3, column 15 was selected, as reflected in the text "Column 15" appearing in status window 303. The selected column is also indicated by a black square or triangle in the otherwise white bar 310. Only one column can be selected at a given time. Cells in the selected column that are also selected by the Map register are highlighted (their color is intensified) in cell grid 302 to help indicate their involvement in data accesses.

Bar 308 at the top of cell grid 302 represents the Column Wildcard register. The XC6200 Column Wildcard register determines which columns of the logic cell array are accessed during configuration. The Column Wildcard register permits multiple columns in the array to be written to simultaneously. Wildcard registers are further described by Kean in U.S. Pat. No. 5,469,003, "Hierarchically Connectable Configurable Cellular Array", which is incorporated herein by reference and title to which is held by the assignee hereof.

Similarly, the Row Wildcard register is represented by bar 309 on the right side of cell grid 302. The Row Wildcard register permits multiple rows in the array to be written to simultaneously. Clicking on either wildcard register bar (308 or 309) causes the value of the associated register to be printed in status window 303 in the lower left portion of the display.

Finally, clicking on a particular cell in cell grid 302 selects the corresponding logic cell for display. The configuration data for the selected cell is displayed in status box 304 in the lower right portion of the display. Note that status box 304 has two modes. One mode displays a graphical representation of the circuit in the selected cell, as shown in FIGS. 3, 4a, and 4b. The other mode displays textual information, as shown in FIG. 4c. Clicking on status box 304 toggles from one type of display to the other. The graphical mode is the default display mode.

The graphical representation in FIG. 4a shows a simplified version of a configured XC6200 logic cell. The XC6200 logic cell is represented by a single multiplexer optionally driving a flip-flop. The inputs to the multiplexer are each labeled with the name of the corresponding logic cell input (N', S', E', or W', with the single quotation mark designating an inversion). (See page 4–256 to 4–260 of the Xilinx Data Book for an explanation of the logic cell inputs and outputs.) The label "F" is positioned on the drawing to indicate which point in the logic cell (multiplexer output, flip-flop output Q, or flip-flop output Q-bar) is used to drive the logic cell output. In FIG. 4a, Q-bar drives the logic cell output. There are a total of five output ports, one in each of the four compass directions, and one additional output (called the "magic" output) to the "south". Each port is labeled with the name of the signal driving the output port. F is the only signal generated in the logic cell; the other signals (N, S, E, W) are programmable interconnect lines.

FIG. 4b is similar to FIG. 4a, except that a differently configured logic cell is shown. The multiplexer drives logic cell output F, and the drawing shows an additional wire clarifying the source of the output.

In the textual display as in FIG. 4c, the same configuration data is shown, but in a different format. For users familiar with the XC6200 device architecture, this textual configuration information is especially useful in debugging the software that originally generated the configuration data. The configuration data shown in FIG. 4c corresponds to that graphically displayed in FIG. 4a. For example, N: F'; means that the "northern" output port is driven by F'. Additional information is also provided. "RP: No protect" means that the register protect capability is disabled. "CS: Q'" means the sequential output Q' is used to provide the logic cell output (i.e., the function unit output is registered and inverted in the flip-flop). ("CS" stands for "Combinational/Sequential".) M: X3' means that the "magic" output is driven by the X3 input, which in this case is S'. Up to 24 bits are displayed in the "State" field, a simple concatenation of the configuration data bits.

The selected logic cell (the logic cell for which configuration and logic cell data is displayed) is numerically identified by row and column in area 306 of FIG. 3. The selected logic cell need not be related to the rows and columns selected using bars 307, 310, 308, and 309.

The graphical display (in common with the other two display modes) also comprises command text window 305. This textual interface permits complete access to the hardware. On-line help is also available from the command line. In one embodiment, the on-line help gives more detailed descriptions of the available commands and their syntax. In another embodiment, the on-line help takes the form of a "Wizard", guiding a user through all or part of the debugging process. These types of user help are well established in the software industry.

Symbol File

A "symbol file" is a text file used to provide stimulus (write data) to probe points within the configured device, and also specifies when a probe point is to be probed (read). The WebScope symbolic display treats groups of cells in a column as a multi-bit variable (corresponding to bits in the Map register) and permits software-like symbolic access to the XC6200 cells. Variables are defined that correspond to one or more probe points, and stimulus is specified for the variables. Each line in the symbol file corresponds to one "state". The WebScope software steps through the symbol file in sequence, one state at a time, in response to the Step button in command panel 301.

FIG. 5 shows an exemplary symbol file. For the WebScope embodiment, the symbol file format is an ASCII text file with several different columns of data. Text following a hash character (#) is treated as a comment and is ignored. The "Name" field includes the name of the variable to be read or written. The "Col" field indicates which column of cells in the XC6200 device corresponds to the variable name. The row or rows in the XC6200 device referenced by the variable are indicated by a 64-bit bit pattern, specified by the Map_high and Map low fields, each of 32 bits and displayed as a hexadecimal value. A '0' bit value in the bit pattern selects a row. (Because the values are written in hexadecimal, any value other than "f" means at least one '0' bit value is present.) In the example of FIG. 5, only one bit is '0', bit 7 (where the rightmost bit of the Map_low column is bit 0). Therefore, only one row (the row corresponding to bit 7) is included in the "clock" variable.

The "R/W" field indicates whether the variable is to be read or written in this state. The "Value" field is only used for variables to be written, and supplies the stimulus value to be written to the specified variable. The value shown in the value field has the same number of bits as the number of selected rows. Therefore, the Value for the "clock" variable is only one bit and has only two possible values, '0' and '1'. The stimulus value is only an initial value, which can be modified interactively from within WebScope using the symbolic display, as described in connection with FIG. 6.

In the example of FIG. 5, the "clock" variable is referenced twice, each time as a write variable. This technique is used to produce a software-driven clock pulse on each step. Because the symbol file entries are read or written in the order in which they are listed, the cell at location (3,7) is first set to '0', then to '1', thereby clocking the circuit.

Symbolic Display Mode

The symbolic display, selected by the Display button in command panel 301, is used to view and edit the stimulus information read from the symbol file.

An exemplary WebScope symbolic display is shown in FIG. 6. FIG. 6 shows the symbolic display resulting from the symbol file of FIG. 5. There are many possible symbolic displays, since the display is based on variables defined by the user in the symbol file.

The Value field of the symbolic display can be either read-only or read/write, as specified in the symbol file. In the symbolic display of FIG. 6, the "clock" variable is read/write, the "random" variable is read-only. Therefore, the "clock" variable values can be edited interactively by the user. Conversely, WebScope does not permit the "random" variable value to be edited, and the entry is grayed out, a common method for indicating an inaccessible graphical element.

Waveform Display Mode

The waveform display draws strip chart diagrams for the variables in the symbol file. This display permits the history of the variables over time to be viewed. This capability is not only useful for spotting transient irregularities in data, but for Digital Signal Processing (DSP) applications as well. This display may also be favored by hardware engineers and others who are more comfortable with the digital waveform displays found in circuit simulators.

As with the symbolic display, the waveform display is driven by the values in the symbol file. The example in FIG. 7 shows the traces for an exemplary circuit using the variables in the symbol file of FIG. 5. The variable "random" references 24 bits from column 5 of the configured device. In this example, the circuit is a 24-bit pseudorandom number generator. The integral value of each variable is displayed as a waveform, with the minimum and maximum possible values shown at the left side of the display. The waveforms in FIG. 7 demonstrate that the exemplary circuit generates a pseudorandom sequence of numbers covering the achievable range of values.

It has been demonstrated that the interactive graphical tool of the invention represents a new level of support for circuit and system development using reconfigurable logic. Uses for the invention include the debugging of user designs, development software that generates configuration data for programmable devices, system level hardware comprising such devices, and the programmable devices themselves.

The above text describes one embodiment of the invention as applied to Xilinx XC6200 devices. However, the invention can also be applied to other programmable devices, including devices other than FPGAs.

Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. An interactive software tool for writing data into a programmable logic device, the tool comprising:

means for accessing via a network server a hardware device designed to interface with the programmable logic device;

interactive means for specifying data to be written to the logic device; and means for transferring the data to the hardware device.

2. The interactive software tool of claim 1, wherein the data comprises configuration data.

3. The interactive software tool of claim 1, wherein the means for specifying comprises a configuration data file.

4. The interactive software tool of claim 1, wherein the means for specifying comprises an interactive graphical display.

5. The interactive software tool of claim 1, wherein said means for accessing comprises a remote server.

6. The interactive software tool of claim 1, wherein the tool is implemented in a high level programming language.

7. The interactive software tool of claim 1, wherein the hardware device comprises a PCI board.

8. An interactive software tool for writing data into a programmable logic device, the tool comprising:

a remote server for remotely accessing a hardware device designed to interface with the programmable logic device;

interactive means for specifying data to be written to the logic device; and means for transferring the data to the hardware device.

9. The interactive software tool of claim 8, wherein the data comprises configuration data.

10. The interactive software tool of claim 8, wherein the means for specifying comprises a configuration data file.

11. The interactive software tool of claim 8, wherein the means for specifying comprises an interactive graphical display.

12. The interactive software tool of claim 8, wherein the tool is implemented in a high level programming language.

13. The interactive software tool of claim 8, wherein the hardware device comprises a PCI board.

14. A method for writing data into a programmable logic device using an interactive software tool, comprising the steps of:

accessing via a network server a hardware device designed to interface with the programmable logic device;

interactively specifying data to be written to the logic device; and transferring the data to the hardware device.

15. The method of claim 14, wherein the data comprises configuration data.

16. The method of claim 14, wherein the dat is specified using a configuration data file.

17. The method of claim 14, wherein the data is specified using an interactive graphical display.

18. The method of claim 14, wherein the hardware device is accessed using a remote server.

19. The method of claim 14, wherein the tool is implemented in a high level programming language.

20. The method of claim 14, wherein the hardware device comprises a PCI board.

21. A method for writing data into a programmable logic device using an interactive software tool, comprising the steps of:

remotely accessing a hardware device designed to interface with the programmable logic device;

interactively specifying data to be written to the logic device; and transferring the data to the hardware device.

22. The method of claim 21, wherein the data comprises configuration data.

23. The method of claim 21, wherein the data is specified using a configuration data file.

24. The method of claim 21, wherein the data is specified using an interactive graphical display.

25. The mtheod of claim 21, wherein the tool is implemented in a high level programming language.

26. The method of claim 21, wherein the hardware device comprises a PCI board.

* * * * *